(12) United States Patent
Okabe et al.

(10) Patent No.: US 7,605,075 B2
(45) Date of Patent: Oct. 20, 2009

(54) MULTILAYER CIRCUIT BOARD AND METHOD OF MANUFACTURING THE SAME

(75) Inventors: Shuichl Okabe, Yasu (JP); Yasumitsu Orii, Shiga (JP); Mitsuya M. Ishida, Ritto (JP)

(73) Assignee: International Business Machines Corporation, Armonk, NY (US)

( * ) Notice: Subject to any disclaimer, the term of this patent is extended or adjusted under 35 U.S.C. 154(b) by 603 days.

(21) Appl. No.: 11/164,791

(22) Filed: Dec. 6, 2005

(65) Prior Publication Data

US 2006/0226537 A1 Oct. 12, 2006

(30) Foreign Application Priority Data

Dec. 6, 2004 (JP) .............................. 2004-353236

(51) Int. Cl.
*H01L 21/4763* (2006.01)
(52) U.S. Cl. ....................... 438/637; 438/629; 438/700; 438/745; 257/E23.067; 257/700; 29/852
(58) Field of Classification Search .......... 257/E23.062, 257/E23.067, 698, 700; 174/267, 255, 264, 174/261; 29/852, 832; 428/209; 438/700, 438/745, 754, 692, 694, 629, 637
See application file for complete search history.

(56) References Cited

U.S. PATENT DOCUMENTS

| | | | | |
|---|---|---|---|---|
| 5,699,613 | A * | 12/1997 | Chong et al. ................... | 29/852 |
| 5,876,842 | A * | 3/1999 | Duffy et al. .................. | 428/209 |
| 6,270,607 | B1 * | 8/2001 | Tachibana ..................... | 156/150 |
| 6,329,610 | B1 * | 12/2001 | Takubo et al. ................ | 174/264 |
| 6,353,189 | B1 * | 3/2002 | Shimada et al. .............. | 174/255 |
| 6,483,714 | B1 * | 11/2002 | Kabumoto et al. ........... | 361/760 |
| 6,531,661 | B2 * | 3/2003 | Uchikawa et al. ............ | 174/255 |
| 6,555,762 | B2 * | 4/2003 | Appelt et al. ................. | 174/264 |
| 6,593,534 | B2 * | 7/2003 | Jones et al. ................... | 174/262 |

(Continued)

FOREIGN PATENT DOCUMENTS

JP 05-047842 2/1993

(Continued)

OTHER PUBLICATIONS

Office Action in Japanese counterpart application 2004-353236 dated Mar. 11, 2008.

*Primary Examiner*—Chris C Chu
(74) *Attorney, Agent, or Firm*—Todd M. C. Li; Joseph Petrokaitis (57) ABSTRACT

A multilayer circuit board is provided that includes at least two insulating layers each sandwiched by circuit layers, thus having at least one internal circuit layer sandwiched by the at least two insulating layers. Via holes are formed in one or more of the insulating layers at the same pitch as bump electrodes of an integrated circuit chip, which permit insertion of the bump electrodes of an integrated circuit chip into the via holes of the multilayer circuit board. Metal films formed within the via holes are electrically connected to at least one of the circuit layers. An internal capacitor may be formed in a predetermined area of an insulating layer and predetermined areas of circuit layers which sandwich the predetermined area of the insulating layer and are opposed to each other. An internal resistor may be formed in an inner circuit layer.

9 Claims, 4 Drawing Sheets

U.S. PATENT DOCUMENTS

| | | | |
|---|---|---|---|
| 6,767,616 B2 * | 7/2004 | Ooi et al. | 428/209 |
| 6,768,064 B2 * | 7/2004 | Higuchi et al. | 174/267 |
| 6,798,666 B1 * | 9/2004 | Alexander et al. | 361/766 |
| 6,800,947 B2 * | 10/2004 | Sathe | 257/780 |
| 6,815,709 B2 * | 11/2004 | Clothier et al. | 257/40 |
| 6,889,155 B2 * | 5/2005 | Ogino et al. | 702/113 |
| 7,155,820 B2 * | 1/2007 | Andoh et al. | 29/852 |
| 7,279,771 B2 * | 10/2007 | Sunohara et al. | 257/516 |

FOREIGN PATENT DOCUMENTS

| | | |
|---|---|---|
| JP | 08-88470 A | 4/1996 |
| JP | 08-330734 A | 12/1996 |
| JP | 09-199861 A | 7/1997 |
| JP | 10-209204 A | 8/1998 |
| JP | 10-322027 A | 12/1998 |
| JP | 2002-319765 A | 10/2002 |
| JP | 2002-344140 A | 11/2002 |
| JP | 2003-142827 | 5/2003 |
| JP | 2003-243829 A | 8/2003 |
| JP | 2003-273520 A | 9/2003 |
| JP | 2006-121008 A | 5/2006 |

* cited by examiner

MULTILAYER CIRCUIT BOARD AND METHOD OF MANUFACTURING THE SAME

FIELD OF THE INVENTION

The present invention relates to a multilayer circuit board and a method of manufacturing the same, and more particularly to a multilayer circuit board suitable for flip-chip mounting and a method of manufacturing the same.

BACKGROUND ART

On a multilayer circuit board, a semiconductor integrated circuit chip is mounted. With a conventional manufacturing technique, the spacing interval (pitch) between pads on a multilayer circuit board could not be as narrow as the pitch of terminal electrodes of a semiconductor integrated circuit chip. Therefore, in general, a semiconductor integrated circuit chip has been positioned on a multilayer circuit board with its terminal electrode side facing up, and the semiconductor integrated circuit chip and the pads of the multilayer circuit board have been connected to each other by wire bonding.

Nevertheless, in recent years, there has been a breakthrough in an alignment technique using a photoresist, a laser drill and the like, enabling the spacing interval between pads on a multilayer circuit board to be as narrow as the pitch of terminal electrodes of a semiconductor integrated circuit chip. Hence, flip-chip mounting has been used for connection of terminal electrodes of a semiconductor integrated circuit chip and pads on a multilayer circuit board. Where flip-chip mounting is used, terminal electrodes of a semiconductor integrated circuit chip are formed into bumps, and the semiconductor integrated circuit chip is placed on a multilayer circuit board with its terminal electrode side facing down, so that the terminal electrodes of the semiconductor integrated circuit chip and the pads of the multilayer circuit board are connected to each other directly. Therefore, wire bonding is no longer needed.

However, it is difficult to obtain highly precise positioning of a semiconductor integrated circuit chip onto a multilayer circuit board. One method for connecting terminal electrodes and pads despite some misalignment of a semiconductor integrated circuit chip is, for example, to increase the size of pads. However, since the spacing interval between the pads is small, this method has its limits.

Meanwhile, circuit elements such as a resistor and a capacitor are also mounted on a multilayer circuit board. As far as voltage drop, parasitic capacitance, noise, signal propagation speed and the like are concerned, it is preferred that these circuit elements be placed as close to a semiconductor integrated circuit chip as possible. However, there is also a limitation with respect to this.

Therefore there is a need to provide a multilayer circuit board that easily enables flip-chip mounting of an integrated circuit chip, and overcomes the limitations discussed above.

SUMMARY OF THE INVENTION

It is generally an object of the present invention to provide a multilayer circuit board easily enables flip-chip mounting of an integrated circuit chip and a method of manufacturing the same.

It is another object of the present invention to provide a multilayer circuit board capable of achieving a close spacing between an integrated circuit chip and a resistor or a capacitor and a method of manufacturing the same.

According to one aspect of the present invention, there is provided a multilayer circuit board which permits mounting of an integrated circuit chip having bump electrodes, the multilayer circuit board comprising the first and second insulating layers, the first to third circuit layers, and the first and second conductive films. The first circuit layer is formed on a top surface of the first insulating layer. The second circuit layer is formed on a bottom surface of the first insulating layer. The second insulating layer is formed on the first circuit layer. The third circuit layer is formed on a surface of the second insulting layer. The first and second insulating layers each have a first via hole permitting an insertion of a bump electrode of the integrated circuit chip. The first conductive film is formed on an inner surface of the first via hole and in contact with at least one of the first to third circuit layers. The second insulating layer has a second via hole permitting an insertion of another bump electrode of the integrated circuit chip. The first and second via holes are formed at the same pitch as for the bump electrodes of the integrated circuit chip. The second conductive film is formed on an inner surface of the second via hole and in contact with at least one of the first and third circuit layers.

In this multilayer circuit board, the via holes permitting an insertion of the bump electrodes of the integrated circuit chip are formed at the same pitch as for the bump electrodes. Therefore, when the integrated circuit chip is flip-chip mounted, the bump electrodes are guided to the via holes and the integrated circuit chip is autonomously positioned.

Preferably, the multilayer circuit board is further provided with metal paste. The metal paste is filled into the first and second via holes.

In this case, since the metal paste is provided for bonding of the bump electrodes and the conductive films formed on the via holes, the flip-chip mounting is performed more easily. In addition, the metal paste enables strong physical fixation of the integrated circuit chip and the multilayer circuit board thus improving electrical conductivity between them, and effectively releases heat generated in the integrated circuit chip to the multilayer circuit board.

Preferably, the multilayer circuit board is further provided with an internal capacitor. The internal capacitor is formed by predetermined areas of the first and second circuit layers, the predetermined areas opposed to each other, and a predetermined area of the first insulating layer sandwiched between the predetermined areas.

In this case, a distance between the integrated circuit chip and the internal capacitor is shorter than a distance between the integrated circuit chip and an external capacitor. Therefore, a voltage drop, a parasite capacitance, a noise and the like are suppressed and a signal propagation speed increases.

Preferably, the multilayer circuit board is further provided with an internal resistance. The internal resistance is formed in the first or second circuit layer.

In this case, a distance between the integrated circuit chip and the internal resistance is shorter than a distance between the integrated circuit chip and an external resistance. Therefore, a voltage drop, a parasite capacitance, a noise and the like are suppressed and a signal propagation speed increases.

Preferably, the first via hole is formed by a first sub via hole formed in the second insulating layer and a second sub via hole formed in the first insulating layer and having a diameter smaller than that of the first sub via hole.

In this case, by emitting a laser beam, the first sub via hole is formed using the third circuit layer as a mask, and, at the same time, the second sub via hole can be formed in the first insulating layer using the first circuit layer as a mask.

According to another aspect of the present invention, there is provided a method of manufacturing a multilayer circuit board which permits mounting of an integrated circuit chip having bump electrodes, the method comprising the steps of forming first and second circuit layers on a top surface and a bottom surface of a first insulating layer, respectively, forming a second insulating layer on the first circuit layer, forming a third circuit layer on a surface of the second insulating layer, forming a first via hole permitting an insertion of a bump electrode of the integrated circuit chip in the first and second insulating layers and a second via hole permitting an insertion of another bump electrode of the integrated circuit chip in the second insulating layer at the same pitch as for the bump electrodes of the integrated circuit chip, forming a first conductive film in contact with at least one of the first to third circuit layers on an inner surface of the first via hole and a second conductive film in contact with at least one of the first and third circuit layers on an inner surface of the second via hole.

In the multilayer circuit board manufactured by the method, the via holes permitting an insertion of the bump electrodes of the integrated circuit chip are formed at the same pitch as for the bump electrodes of the integrated circuit chip. Therefore, when the integrated circuit chip is flip-chip mounted, the bump electrodes are guided to the via holes and the integrated circuit chip is autonomously positioned.

Preferably, the method of manufacturing the multilayer circuit board further comprises a step of filling the first and second via holes with metal paste.

In this case, since the metal paste is provided for bonding of the bump electrodes and the conductive films formed on the via holes, the flip-chip mounting is performed more easily. In addition, the metal paste enables strong physical fixation of the integrated circuit chip and the multilayer circuit board thus improving electrical conductivity between them, and effectively releases heat generated in the integrated circuit chip to the multilayer circuit board.

Preferably, the step of forming the first and second circuit layers includes forming the first and second circuit layers so that predetermined areas of the first and second circuit layers are opposed to each other to sandwich a predetermined area of the first insulating layer therebetween in order to form an internal capacitor.

In this case, a distance between the integrated circuit chip and the internal capacitor is shorter than a distance between the integrated circuit chip and an external capacitor. Therefore, a voltage drop, a parasite capacitance, a noise and the like are suppressed and a signal propagation speed increases.

Preferably, the method of manufacturing the multilayer circuit board further includes a step of forming an internal resistance in the first or second circuit layer.

In this case, a distance between the integrated circuit chip and the internal resistance is shorter than a distance between the integrated circuit chip and an external resistance. Therefore, a voltage drop, a parasite capacitance, a noise and the like are suppressed and a signal propagation speed increases.

Preferably, the third circuit layer has a first hole. The first circuit layer has a second hole smaller than the first hole at a position opposed to the first hole. The step of forming the first via hole includes forming a first sub via hole communicating with the first hole in the second insulating layer with the third circuit layer as a mask and a second sub via hole communicating with the second hole in the first insulating layer with the first circuit layer as a mask by irradiating the third circuit layer with a laser beam from above.

In this case, since the first and second sub via holes are formed simultaneously, misalignment hardly occurs and highly accurate positioning of a leaser head is not necessary.

Note that a single or plurality of insulating layers and circuit layers may be further formed on the second or third circuit layer. For example, the third insulating layer may be formed on the third circuit layer and a fourth circuit layer may be further formed on the third insulating layer. In this case, the first sub via hole may be formed in the second and third insulating layers.

DETAILED DESCRIPTION OF THE PREFERRED EMBODIMENT

Hereinafter, a method for manufacturing a multilayer circuit board according to an embodiment of the present invention is described with reference to FIGS. 1A to 1L. The same or equivalent parts or members in the drawings are designated by the same reference numerals and thus descriptions thereof are not repeatedly given.

Figure 1A:
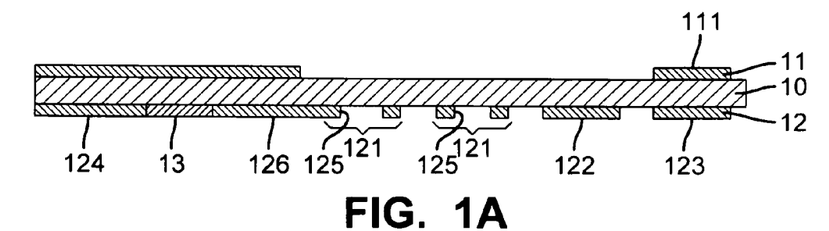
FIG. 1A is a cross-sectional view showing the first process of a method of manufacturing a multilayer circuit board according to an embodiment of the present invention.

Referring to FIG. 1A, after preparation of a core insulating layer 10, an inner circuit layer 11 is formed on the top surface of the core insulating layer 10 and an inner circuit layer 12 is formed on the bottom surface of the same. The inner circuit layers 11 and 12 are formed into desired patterns by etching. More specifically, a disc-shaped via land 111 is formed within the inner circuit layer 11, a toroidal via land 121 and disc-shaped via lands 122 to 124 are formed within the inner circuit layer 12. A hole 125 is made within the toroidal via land 121. The via lands 111, and 121 to 124 are positioned so that they will work as masks at a drilling process (see FIG. 1D) later.

The thickness of the core insulating layer 10 is, for example, between 30 and 100 µm and preferably about 50 µm. The material of the core insulating layer 10 is normally a substrate material or a high dielectric material, such as a glass epoxy material.

Moreover, an internal resistor 13 may be formed in the inner circuit layer 12 between the via land 124 and the rest of the part 126. The internal resistor 13 may be formed by filling therebetween with a material such as a high resistant material.

Figure 1B:
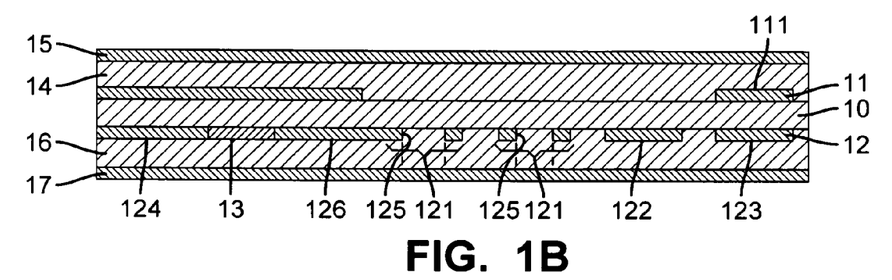
FIG. 1B is a cross-sectional view showing a process following FIG. 1A.

Next, referring to FIG. 1B, a preimpregnation material is formed as an outer insulating layer 14 on the inner circuit layer 11, and a copper foil 15 is further formed on the outer insulating layer 14. Similarly, an outer insulating layer 16 and a copper foil 17 are formed on the inner circuit layer 12 on the other side.

Figure 1C:
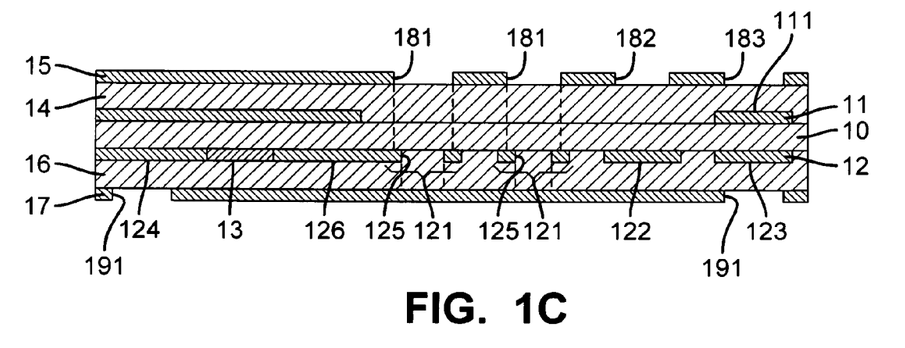
FIG. 1C is a cross-sectional view showing a process following FIG. 1B.

Next, referring to FIG. 1C, the copper foils 15 and 17 are formed into desired patterns by etching. Here, holes 181 to 183 and 191 are made at predetermined positions so that the copper foils 15 and 17 will function as masks in a drilling process (see FIG. 1D) later. The holes 125 and 181 are made at positions so that they are opposed to each other and approximately coaxial. The diameter φ2 of the hole 181 is larger than the diameter φ3 of the hole 125 (see FIG. 2).

Figure 1D:
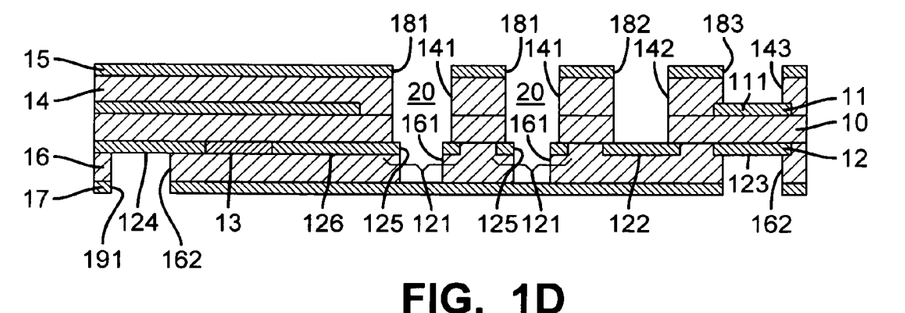
FIG. 1D is a cross-sectional view showing a process following FIG. 1C.
Figure 2:
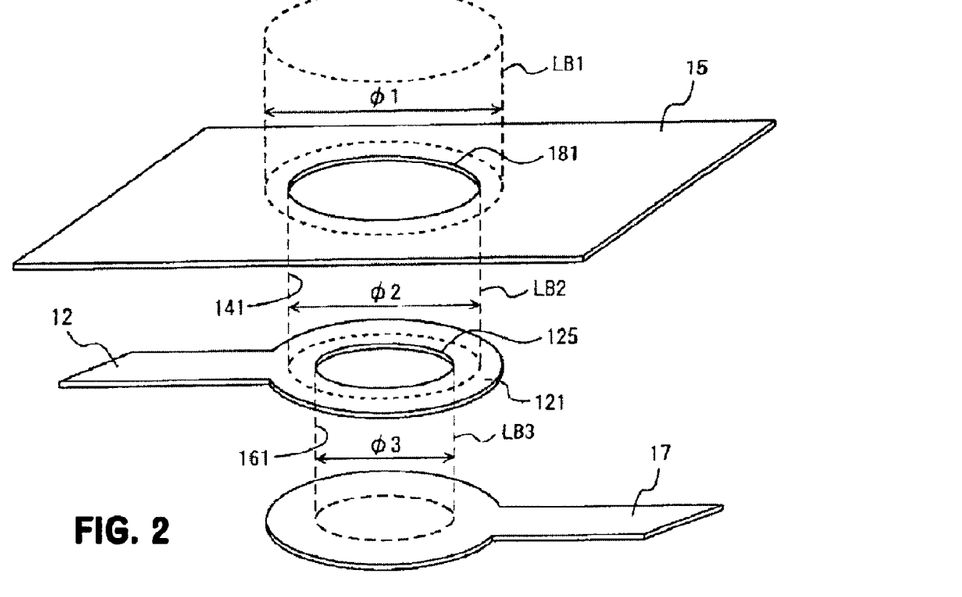
FIG. 2 is a perspective view showing a drilling process by a laser shown in FIG. 1D.

Next, Referring to FIGS. 1D and 2, a laser beam LB1 is emitted from above the copper foil 15 to make holes in the insulating layers 10, 14 and 16. The diameter φ2 of the hole 181 made in the copper foil 15 is smaller than the diameter φ1 of the laser beam LB1 emitted. Therefore, the copper foil 15 functions as a mask and a via hole 141 with the diameter φ2 is formed in the outer insulating layer 14 and the core insulating layer 10. A diameter φ3 of the hole 125 made in the inner circuit layer 12 controls the diameter of laser beam LB3 which extends past hole 125 and is smaller than the diameter φ2 of a laser beam LB2 which formed the via hole 141. Therefore, the inner circuit layer 12 also functions as a mask and so a via hole 161 with the diameter φ3 is also formed in the outer insulating layer 16. The via holes 141 and 161 make up a single via hole 20 which passes through the outer insulating layer 14, the core insulating layer 10, and the outer insulating layer 16. Since the via holes 141 and 161 are formed simultaneously, misalignment hardly occurs and highly accurate positioning of the laser head is not necessary.

Similarly, a via hole 142 is formed by a laser beam emission. In this case, the laser beam is blocked by the via land 122. Therefore, the via hole 142 passes through the outer insulating layer 14 and the core insulating layer 10. Similarly, a via hole 143 is formed by a laser beam emission. In this case, the laser beam is blocked by the via land 111. Therefore, the via hole 143 passes through the outer insulating layer 14 only.

On the other hand, via holes 162 are formed by a laser beam emitted from above the copper foil 17. In this case, since the laser beam is blocked by the via lands 123 and 124, the via hole 162 passes through the outer insulating layer 16 only.

According to the abovementioned method, the via holes 20, 141, 142, 143 and 162 can be formed merely by scanning the copper foils 15 and 17 with laser beams. Hence, highly accurate positioning of a laser head is not required. As for the laser, for example, a carbon dioxide gas laser is used.

Figure 1E:
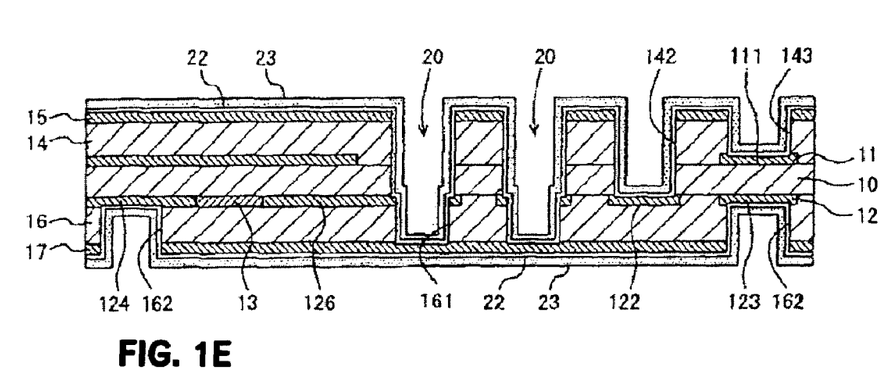
FIG. 1E is a cross-sectional view showing a process following FIG. 1D.

Next, referring to FIG. 1E, a metal thin film (not shown) such as a copper (Cu) film and a nickel (Ni) film is formed on the entire surface by electroless plating, and thereafter a lower metal film 22 is formed by electrolytic plating and an upper metal film 23 is further formed on the lower metal film 22 by electrolytic plating. Since the electroless plating is performed in advance, the lower metal film 22 and the upper metal film 23 are formed not only on the copper foils 15 and 17 but also on the side walls within the via holes 20, 142, 143 and 162 and the via lands 111 and 121 to 124.

The lower metal film 22 and the upper metal film 23 are formed from metals different from each other, preferably having different etching properties from each other. More specifically, a combination of tin (Su) and copper (Cu), nickel (Ni) and copper (Cu), silver (Ag) and copper (Cu) or the like is used.

Figure 1F:
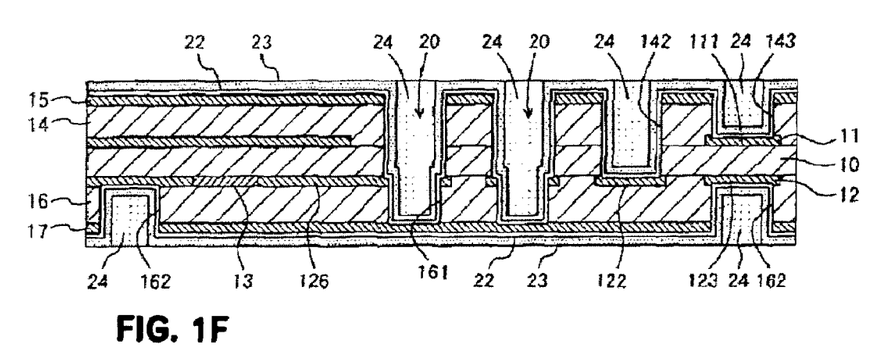
FIG. 1F is a cross sectional view showing a process following FIG. 1E.

Next, referring to FIG. 1F, the via holes 20, 142, 143, and 162 are filled with soldering paste 24. More specifically, after filling the via holes 20, 142, 143, and 162 with the soldering paste, the entire board is heated in an oven to melt the soldering paste. Subsequently, after the entire board is cooled and the soldering paste is solidified, the surfaces of the soldering paste are flattened by polishing so that the heights of the soldering paste surfaces become uniform. In order to fill the via holes 20, 142, 143 and 162 having bottoms with the soldering paste without leaving any space, squeegee filling, for example, can be performed under vacuum.

Figure 1G:
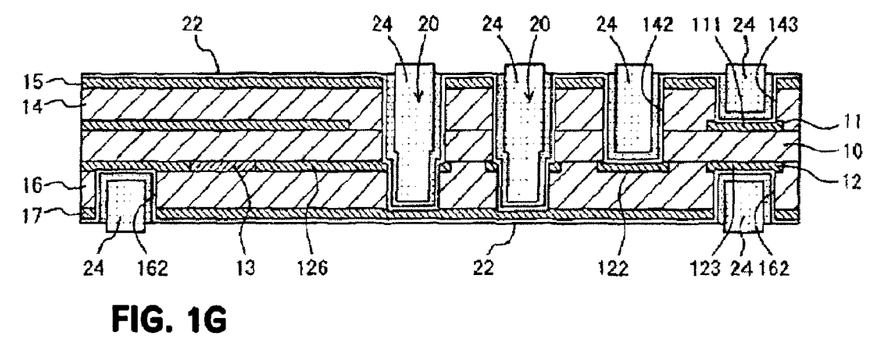
FIG. 1G is a cross sectional view showing a process following FIG. 1F.

Next, referring to FIG. 1G, only the upper metal film 23 is etched and removed without etching the lower metal film 22 and the soldering paste 24. Where tin is used for the lower metal film 22 and copper is used for the upper metal film 23, an ammonia-based liquid, for example, is used as an etchant which dissolves copper but does not dissolve tin. Where nickel is used for the lower metal film 22 and copper is used for the upper metal film 23, an ammonia-based liquid, for example, is used as an etchant which dissolves copper but does not dissolves nickel.

Figure 1H:
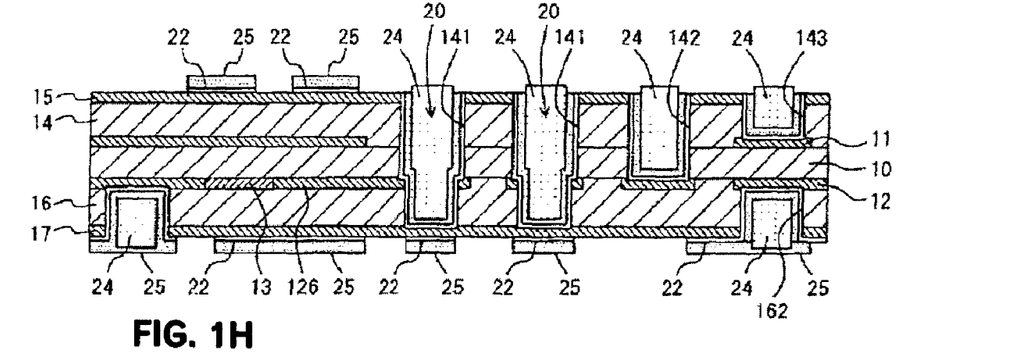
FIG. 1H is a cross-sectional view showing a process following FIG. 1G.

Next, referring to FIG. 1H, a photoresist 25 is formed on the lower metal film 22 and machined into a desired circuit pattern. Thereafter, by using the photoresist 25 as a mask, only the lower metal film 22 is etched and removed without etching the copper foils 15 and 17. Where tin is used for the lower metal film 22, a nitrate-based non-fluoride and non-hydrogen peroxide liquid, for example, is used as an etchant which dissolves tin but does not dissolve copper. Where nickel is used for the lower metal film 22, a hydrogen peroxide-based liquid, for example, is used as an etchant which dissolves nickel but does not dissolve copper.

The lower metal film 22 is used as a mask when the copper foils 15 and 17 are etched by a subtractive process. Hence, it is preferred that the lower metal film 22 be as thin as possible in order to form thin and narrow-pitched lines. Equally, it is preferred that the photoresist 25 be as thin as possible since the photoresist 25 is used as a mask when the lower metal film 22 is etched.

Figure 1I:
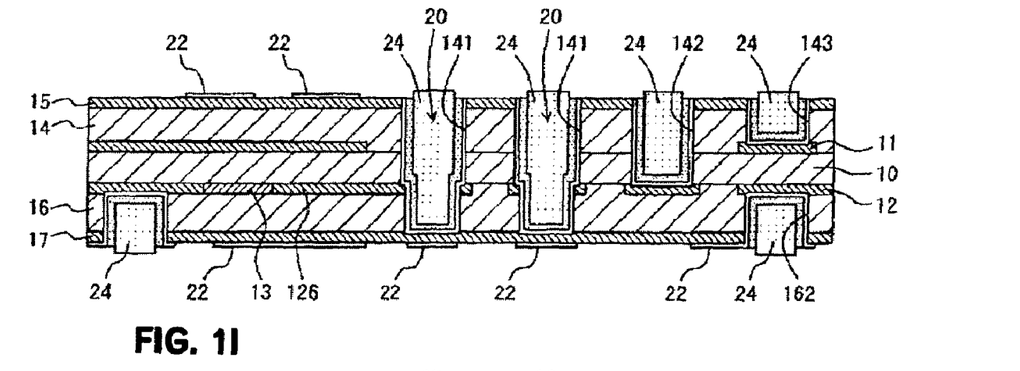
FIG. 1I is a cross-sectional view showing a process following FIG. 1H.

Next, referring to FIG. 1I, the photoresist 25 is removed. Therefore, the lower metal film 22 machined into a desired circuit pattern is obtained.

Figure 1J:
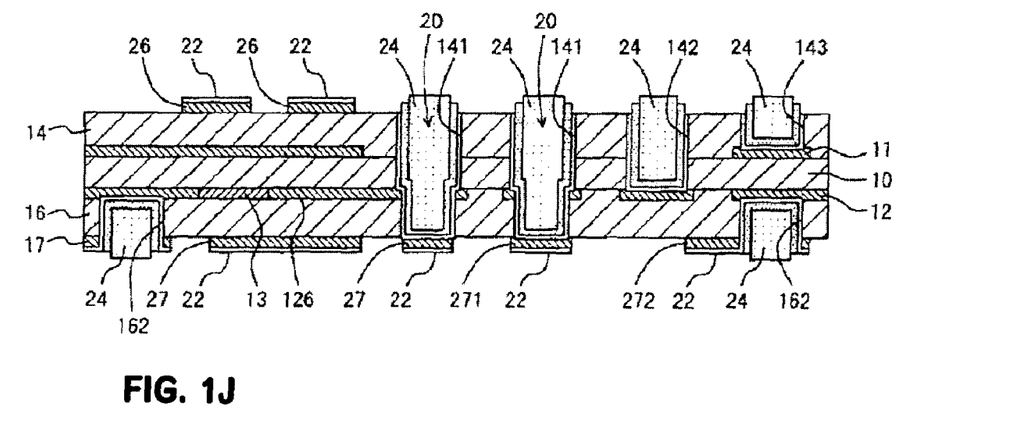
FIG. 1J is a cross-sectional view showing a process following FIG. 1I.

Next, referring to FIG. 1J, the copper films 15 and 17 are etched into a desired circuit pattern by using the lower metal film 22 as a mask, thus forming outer circuit layers 26, 27, 271, and 272. Where tin is used for the lower metal film 22, an etchant which dissolves copper but does not dissolve tin is used. Where nickel is used for the lower metal film 22, an etchant which dissolves copper but does not dissolve nickel is used.

Figure 1K:
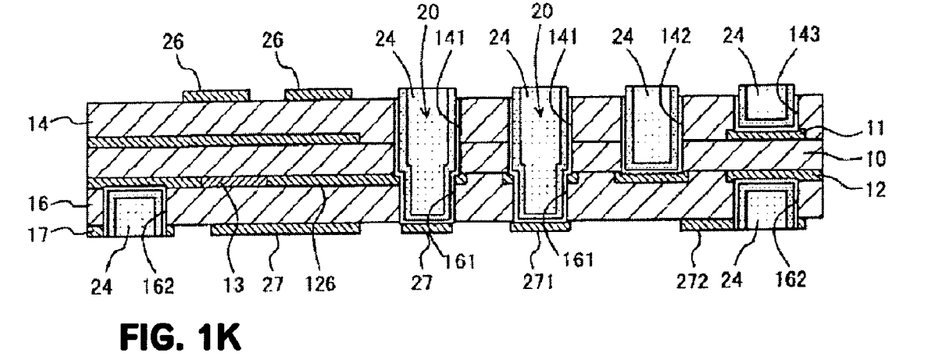
FIG. 1K is a cross-sectional view showing a process following FIG. 1J.

Next, referring to FIG. 1K, only the lower metal film 22 is etched and removed without etching the outer circuit layers 26, 27, 271 and 272. Where tin is used for the lower metal film 22, an etchant which dissolves tin but does not dissolve copper is used. Where nickel is used for the lower metal film 22, an etchant which dissolves nickel but does not dissolve copper is used. In this case, an etchant which also dissolves the soldering paste 24 may be selected, and alternatively, an etchant which does not dissolve the soldering paste 24 may also be selected.

Figure 1L:
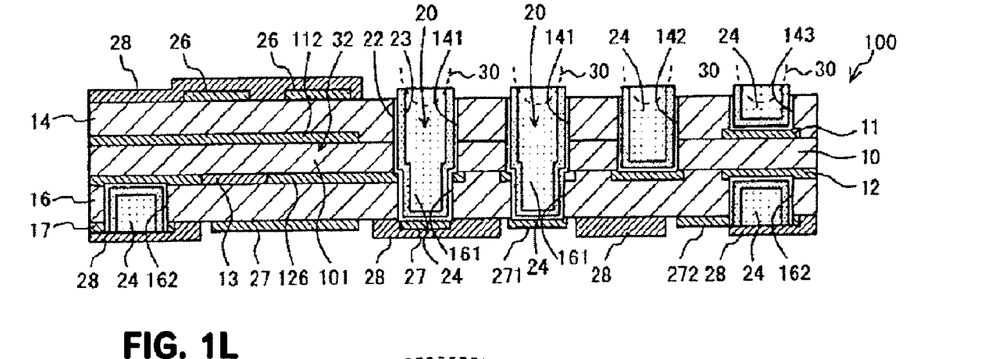
FIG. 1L is a cross-sectional view showing a final process following FIG. 1K.

Finally, referring to FIG. 1L, solder resists 28 are formed in desired areas. Thus, the multilayer circuit board 100 according to the embodiment of the present invention is completed.

The completed multilayer circuit board 100 is provided with the core insulating layer 10, the inner circuit layer 11 formed on the top surface of the core insulating layer 10, the inner circuit layer 12 formed on the bottom surface of the core insulating layer 10, the outer insulating layer 14 formed on the inner circuit layer 11, the outer insulating layer 16 formed on the inner circuit layer 12, the outer circuit layer 26 formed on the surface of the outer insulating layer 14, and the outer circuit layers 27, 271 and 272 formed on the surface of the outer insulating layer 16.

The via holes 20 which permits an insertion of the bump electrodes 30 of the semiconductor integrated circuit chip are formed in the core insulating layer 10 and the outer insulating layers 14 and 16. Each of the via holes 20 includes the via hole 141 formed in the outer insulating layer 14 and the core insulating layer 10 and the via hole 161 formed in the outer insulating layer 16 and having a diameter smaller than that of the via hole 141. The via hole 142 which permits an insertion of another bump electrode 30 of the semiconductor integrated circuit chip is formed in the core insulating layer 10 and the outer insulating layer 14. The via hole 143 which permits yet another bump electrode 30 of the semiconductor integrated circuit chip is formed in the outer insulating layer 14. The via holes 20, 142, 143 are formed at the same pitch as for the bump electrodes of the semiconductor integrated circuit chip. Therefore, when the integrated circuit chip is flip-chip mounted on the multilayer circuit board 100, the bump electrodes 30 are guided into the via holes 20, 142 and 143, and the integrated circuit chip is autonomously positioned. Note that the via holes 162 are also formed in the outer insulating layer 16.

On the inner surface of the via holes 20, 142, 143 and 162, the lower metal film 22 and the upper metal film 23 are formed. The lower metal films 22 within the via holes 20 come into contact with the inner circuit layer 12 and the outer circuit layers 27 and 271, respectively. Therefore, the bump electrodes 30 mounted into the via holes 20 are electrically connected to the inner circuit layer 12 and the outer circuit layers 17 and 271. The lower metal layer 22 within the via hole 142 comes into contact with the inner circuit layer 12. Therefore, the bump electrode 30 mounted into the via hole 142 is electrically connected to the inner circuit layer 12. The lower metal film 22 within the via hole 143 comes into contact with the inner circuit layer 11. Therefore, the bump electrode 30 mounted on the via hole 143 is electrically connected to the inner circuit layer 11.

The via holes 20, 142, 143 and 162 are filled with the soldering paste 24. Since the soldering paste 24 is provided for bonding the bump electrodes 30 and the upper metal layers 23, flip-chip mounting is performed more easily. In addition, the metal paste enables strong physical fixation of the integrated circuit chip and the multilayer circuit board 100 thus improving electrical conductivity between them, and effectively releases heat generated in the semiconductor integrated circuit chip to the multilayer circuit board 100.

The multilayer circuit board 100 is also provided with the internal capacitor 32. The internal capacitor 32 is formed of predetermined areas 112 and 126 of the inner circuit layers 11 and 12, the predetermined areas opposed to each other, and a predetermined area 101 of the core insulating layer 10 sandwiched between the predetermined areas 112 and 126. The multilayer circuit board 100 is further provided with an internal resistor 13. The internal resistor 13 is formed in the inner circuit layer 12. Distances between the semiconductor integrated circuit chip and both the inner capacitor 32 and the internal resistor 13 are shorter than those between the semiconductor integrated circuit chip and both an external capacitor and an external resistor. Hence, voltage drop, parasite capacitance, noise and the like are suppressed and signal propagation speed increases.

Further, by attaching external capacitors and external resistors to the outer circuit layers (pads) 271 and 272, distances between both the outer capacitors and outer resistors and the bump electrodes of a semiconductor integrated circuit chip can be shorter. Accordingly, an optimal mounting structure of external parts can be realized such that voltage drop, parasite capacitance, noise and the like are suppressed and signal propagation speed increases.

The multilayer circuit board 100 according to the foregoing embodiment has three insulating layers 10, 14 and 16 and four circuit layers 11, 12, 26, and 27. However, the multilayer circuit board 100 may have more insulating layers and circuit layers or two insulating layer and three circuit layers. In other words, the multilayer circuit board 100 may have any number of insulating layers and circuit layers as long as it has at least two insulating layers and at least three circuit layers.

Moreover, in the foregoing multilayer circuit board 100, the via hole 141 with a larger diameter is formed in the outer insulating layer 14 and the core insulating layer 10, and the via hole 161 having a smaller diameter is formed in the outer insulating layer 16. However, the via hole with a larger diameter can be formed only in the outer insulating layer 14 and the via hole with a smaller diameter may be formed only in the core insulating layer 10.

The embodiment of the present invention has been described above but it is merely an example of implementation of the present invention. Therefore, the present invention is not limited to the abovementioned embodiment and changes can be made in the embodiment as appropriate without departing from the gist of the present invention.

What is claimed is:

1. A method of manufacturing a multilayer circuit board which permits mounting of an integrated circuit chip having bump electrodes spaced at a pitch, the method comprising the steps of:
   a) forming first and second patterned circuit layers, each circuit layer including a plurality of metal patterns, on a top surface and a bottom surface of a first insulating layer, respectively;
   b) after step (a), forming a second insulating layer on said first circuit layer and a third circuit layer on a surface of the second insulating layer;
   c) after step (b), forming a first via hole permitting an insertion of one of the bump electrodes of the integrated circuit chip in the first and second insulating layers and a second via hole permitting an insertion of another one of the bump electrodes of the integrated circuit chip in the second insulating layer at the same pitch as for the bump electrodes of the integrated circuit chip; and
   d) after step (c), forming a first conductive film in contact with a metal pattern of at least one of the first to third circuit layers on an inner surface of the first via hole and a second conductive film in contact with a metal pattern of at least one of the first and third circuit layers on an inner surface of the second via hole.

2. The method according to claim 1, further comprising a step of filling the first and second via holes with metal paste.

3. The method according to claim 1, wherein the step of forming the first and second circuit layers includes forming the first and second circuit layers so that predetermined areas of the first and second circuit layers are opposed to each other with a predetermined area of the first insulating layer put therebetween in order to form an internal capacitor.

4. The method according to claim 1, wherein step (a) includes forming a resistor connected with at least one of said first or second circuit layers and disposed.

5. The method according to claim 1, wherein step (d) further comprises forming said first conductive film on an inner surface of the second via hole and forming the second conductive film on said first conductive film in said first and second via holes.

6. The method according to claim 5, wherein said first conductive film comprises a metal different from a metal of which said second conductive film consists.

7. The method according to claim 5, wherein said first conductive film has different etching properties than said second conductive film.

8. The method according to claim 1, wherein the third circuit layer has a first hole and the first circuit layer has a second hole smaller than the first hole at a position opposed to the first hole, and wherein the step of forming the first via hole includes forming a first sub via hole communicating with the first hole in the second insulating layer with the third circuit layer as a mask and a second sub via hole communicating with the second hole in the second insulating layer with the first circuit layer as a mask by irradiating the third circuit layer with a laser beam from above.

9. A method of manufacturing a multilayer circuit board which permits mounting of an integrated circuit chip having bump electrodes spaced at a pitch, the method comprising the steps of:

a) forming first and second circuit layers on a top surface and a bottom surface of a first insulating layer, respectively;

b) forming a second insulating layer on said first circuit layer and a third circuit layer on a surface of the second insulating layer;

c) forming a first via hole permitting an insertion of one of the bump electrodes of the integrated circuit chip in the first and second insulating layers and a second via hole permitting an insertion of another one of the bump electrodes of the integrated circuit chip in the second insulating layer at the same pitch as for the bump electrodes of the integrated circuit chip; and d) forming a first conductive film in contact with at least one of the first, second or third circuit layers on an inner surface of the first via hole and a second conductive film in contact with at least one of the first and third circuit layers on an inner surface of the second via hole wherein the third circuit layer has a first hole and the first circuit layer has a second hole smaller than the first hole at a position opposed to the first hole, and wherein step (c) includes forming a first sub via hole communicating with the first hole in the second insulating layer with the third circuit layer as a mask and a second sub via hole communicating with the second hole in the second insulating layer with the first circuit layer as a mask by irradiating the third circuit layer with a laser beam from above.

* * * * *

UNITED STATES PATENT AND TRADEMARK OFFICE
CERTIFICATE OF CORRECTION

PATENT NO.        : 7,605,075 B2                                    Page 1 of 1
APPLICATION NO.   : 11/164791
DATED             : October 20, 2009
INVENTOR(S)       : Okabe et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 921 days.

Signed and Sealed this

Fifth Day of October, 2010

David J. Kappos
*Director of the United States Patent and Trademark Office*